United States Patent
Pang et al.

(10) Patent No.: US 8,612,903 B2
(45) Date of Patent: Dec. 17, 2013

(54) TECHNIQUE FOR REPAIRING A REFLECTIVE PHOTO-MASK

(75) Inventors: Linyong Pang, Los Gatos, CA (US); Christopher Heinz Clifford, San Francisco, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 23 days.

(21) Appl. No.: 13/024,233

(22) Filed: Feb. 9, 2011

(65) Prior Publication Data

US 2012/0066651 A1    Mar. 15, 2012

Related U.S. Application Data

(63) Continuation-in-part of application No. 13/021,591, filed on Feb. 4, 2011.

(60) Provisional application No. 61/382,857, filed on Sep. 14, 2010.

(51) Int. Cl.
   *G06F 17/50*         (2006.01)

(52) U.S. Cl.
   USPC ............................................ 716/55; 716/132

(58) Field of Classification Search
   USPC .................................................... 716/55, 132
   See application file for complete search history.

(56) References Cited

U.S. PATENT DOCUMENTS

| | | |
|---|---|---|
| 5,640,199 A | 6/1997 | Garakani et al. |
| 6,042,998 A | 3/2000 | Brueck et al. |
| 6,235,434 B1 | 5/2001 | Sweeney et al. |
| 6,480,285 B1 * | 11/2002 | Hill ................................. 356/492 |
| 6,484,306 B1 | 11/2002 | Bokor et al. |
| 6,563,566 B2 | 5/2003 | Rosenbluth et al. |
| 6,709,792 B2 | 3/2004 | Nako |
| 6,871,337 B2 | 3/2005 | Socha |
| 6,873,720 B2 | 3/2005 | Cai et al. |
| 6,925,202 B2 | 8/2005 | Karklin et al. |
| 7,003,755 B2 | 2/2006 | Pang et al. |

(Continued)

FOREIGN PATENT DOCUMENTS

| | | |
|---|---|---|
| WO | WO 2005/078528 A2 | 8/2005 |
| WO | WO 2005/078528 A3 | 8/2005 |
| WO | WO 2008/039674 A2 | 4/2008 |
| WO | WO 2008/039674 A3 | 4/2008 |

OTHER PUBLICATIONS

Clifford, C. H., "Technique for Analyzing a Reflective Photo-Mask," U.S. Appl. No. 13/021,591, filed Feb. 4, 2011.

(Continued)

*Primary Examiner* — Thuan Do
(74) *Attorney, Agent, or Firm* — Wilson Sonsini Goodrich & Rosati

(57) ABSTRACT

During a calculation technique, a modification to a reflective photo-mask is calculated. In particular, using information associated with different types of analysis techniques a group of one or more potential defects in the reflective photo-mask is determined. Then, the modification to the reflective photo-mask is calculated based on at least a subset of the group of potential defects using an inverse optical calculation. In particular, during the inverse optical calculation, a cost function at an image plane in a model of the photolithographic process is used to determine the modification to the reflective photo-mask at an object plane in the model of the photolithographic process.

20 Claims, 7 Drawing Sheets

(56) References Cited

U.S. PATENT DOCUMENTS

| | | |
|---|---|---|
| 7,043,071 B2 | 5/2006 | Qian et al. |
| 7,057,709 B2 | 6/2006 | Rosenbluth |
| 7,073,162 B2 | 7/2006 | Cobb et al. |
| 7,093,226 B2 | 8/2006 | Pang |
| 7,093,229 B2 | 8/2006 | Pang et al. |
| 7,107,573 B2 | 9/2006 | Yamazoe et al. |
| 7,124,394 B1 | 10/2006 | Abrams et al. |
| 7,152,219 B2 | 12/2006 | Pang |
| 7,178,127 B2 | 2/2007 | Abrams et al. |
| 7,231,628 B2 | 6/2007 | Pack et al. |
| 7,254,251 B2 | 8/2007 | Cai et al. |
| 7,302,090 B2 | 11/2007 | Kalus et al. |
| 7,363,611 B2 | 4/2008 | Rosenbluth |
| 7,376,512 B2 | 5/2008 | Hirscher et al. |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,646,906 B2 | 1/2010 | Saidin et al. |
| 7,676,077 B2 * | 3/2010 | Kulkarni et al. ............ 382/144 |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,200,002 B2 | 6/2012 | Preil et al. |
| 8,204,295 B2 | 6/2012 | Preil et al. |
| 8,208,712 B2 | 6/2012 | Preil et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 8,458,622 B2 | 6/2013 | Pang et al. |
| 8,463,016 B2 | 6/2013 | Pang |
| 2002/0192578 A1 | 12/2002 | Tanaka et al. |
| 2003/0103189 A1 | 6/2003 | Neureuther et al. |
| 2003/0106642 A1 | 6/2003 | Fairbairn et al. |
| 2004/0008880 A1 | 1/2004 | Horie et al. |
| 2004/0265707 A1 | 12/2004 | Socha |
| 2005/0122500 A1 | 6/2005 | Ye et al. |
| 2005/0168498 A1 | 8/2005 | Granik |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0273242 A1 | 12/2006 | Hunsche et al. |
| 2007/0133862 A1 | 6/2007 | Gold et al. |
| 2007/0198963 A1 | 8/2007 | Granik et al. |
| 2008/0152212 A1 | 6/2008 | Feldman |
| 2008/0170774 A1 | 7/2008 | Xiong et al. |
| 2008/0198350 A1 | 8/2008 | Sugita et al. |
| 2008/0241708 A1 | 10/2008 | Lin et al. |
| 2010/0021042 A1 | 1/2010 | Preil |
| 2010/0021043 A1 | 1/2010 | Preil |
| 2010/0021824 A1 | 1/2010 | Preil |
| 2010/0080443 A1 | 4/2010 | Preil |
| 2010/0086195 A1 | 4/2010 | Preil |
| 2010/0119143 A1 | 5/2010 | Preil |
| 2010/0135568 A1 | 6/2010 | Preil |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066652 A1 | 3/2012 | Clifford |
| 2012/0134542 A1 | 5/2012 | Pang et al. |
| 2012/0137260 A1 | 5/2012 | Pang et al. |
| 2012/0189187 A9 | 7/2012 | Preil et al. |

OTHER PUBLICATIONS

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Pang, L. et al., "Computational Lithogaphy & Inspection (CLI) and its Applications in Mask Inspection, Metrology, Review, and Repair," Luminescent Technologies Inc., Palo Alto, CA, Sep. 28, 2010.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Notice of Allowance issued by U.S. Patent and Trademark Office, mailed May 31, 2013, in Clifford, C., U.S. Appl. No. 13/021,591, "Technique for Analyzing a Reflective Photo-Mask" filed Feb. 4, 2011.

Preliminary Amendment filed Jan. 27, 2010, in Preil, Moshe E. et al., U.S. Appl. No. 12/475,331, "Photo-Mask and Wafer Image Reconstruction" filed May 29, 2009.

Notice of Allowance issued by U.S. Patent and Trademark Office, mailed Nov. 14, 2011, in Preil, Moshe E. et al., U.S. Appl. No. 12/475,331, "Photo-Mask and Wafer Image Reconstruction" filed May 29, 2009.

Amendment and Request for Continued Examination filed Feb. 13, 2012 in Preil, Moshe E., et al. U.S. Appl. No. 12/475,331, "Photo-Mask and Wafer Image Reconstruction" filed May 29, 2009.

Notice of Allowance issued by U.S. Patent and Trademark Office, mailed Feb. 17, 2012, in Preil, Moshe E. et al., U.S. Appl. No. 12/475,331, "Photo-Mask and Wafer Image Reconstruction" filed May 29, 2009.

Office Action issued by U.S. Patent and Trademark Office, mailed Oct. 25, 2011, in Peril, Moshe E. et al., U.S. Appl. No. 12/475,338, "Photo-Mask and Wafer Image Reconstruction" filed May 29, 2009.

Response to Office Action filed Feb. 14, 2012, in Preil, Moshe E. et al., U.S. Appl. No. 12/475,338, "Photo-Mask and Wafer Image Reconstruction" filed May 29, 2009.

Notice of Allowance issued by U.S. Patent and Trademark Office, mailed May 4, 2012, in Preil, Moshe E. et al., U.S. Appl. No. 12/475,338, "Photo-Mask and Wafer Image Reconstruction" filed May 29, 2009.

Office Action issued by U.S. Patent and Trademark Office, mailed Oct. 24, 2011, in Preil, Moshe E. et al., U.S. Appl. No. 12/475,349, "Photo-Mask and Wafer Image Reconstruction" filed May 29, 2009.

Response to Office Action filed Feb. 14, 2012, in Preil, Moshe E. et al., U.S. Appl. No. 12/475,349, "Photo-Mask and Wafer Image Reconstruction" filed May 29, 2009.

Office Action issued by U.S. Patent and Trademark Office, mailed Oct. 24, 2011, in Preil, Moshe E. et al., U.S. Appl. No. 12/475,361, "Photo-Mask and Wafer Image Reconstruction" filed May 29, 2009.

Response to Office Action filed Feb. 15, 2012, in Preil, Moshe E. et al., U.S. Appl. No. 12/475,361, "Photo-Mask and Wafer Image Reconstruction" filed May 29, 2009.

Office Action issued by U.S. Patent and Trademark Office, mailed Mar. 9, 2012, in Preil, Moshe E. et al., U.S. Appl. No. 12/475,361, "Photo-Mask and Wafer Image Reconstruction" filed May 29, 2009.

Response to Office Action filed Jul. 9, 2012, in Preil, Moshe E. et al., U.S. Appl. No. 12/475,361, "Photo-Mask and Wafer Image Reconstruction" filed May 29, 2009.

Office Action issued by U.S. Patent and Trademark Office, mailed Nov. 16, 2011, in Preil, Moshe E. et al., U.S. Appl. No. 12/475,369, "Photo-Mask and Wafer Image Reconstruction" filed May 29, 2009.

Response to Office Action filed Feb. 15, 2012, in Preil, Moshe E. et al., U.S. Appl. No. 12/475,369, "Photo-Mask and Wafer Image Reconstruction" filed May 29, 2009.

(56) References Cited

OTHER PUBLICATIONS

Notice of Allowance issued by U.S. Patent and Trademark Office, mailed Mar. 11, 2012, in Preil, Moshe E. et al., U.S. Appl. No. 12/475,369, "Photo-Mask and Wafer Image Reconstruction" filed May 29, 2009.

Preliminary Amendment filed Feb. 13, 2012, Preil, Moshe E. et al., U.S. Appl. No. 12/440,722, "Photo-Mask and Wafer Image Reconstruction" filed Feb. 5, 2010.

Written Opinion issued by U.S. Patent and Trademark Office, mailed Mar. 25, 2008, in Luminescent Technologies, Inc. International Application No. PCT/US07/078913, "Photo-Mask and Wafer Image Reconstruction" filed Sep. 19, 2007.

Response to Written Opinion filed Jul. 17, 2008, in Luminescent Technologies, Inc. International Application No. PCT/US07/078913, "Photo-Mask and Wafer Image Reconstruction" filed Sep. 19, 2007.

Satake, et al., "Technique for Repairing a Reflective Photo-Mask," U.S. Appl No. 13/764,517, filed Feb. 11, 2013.

Notice of Allowance issued by U.S. Patent and Trademark Office, mailed Oct. 2, 2012, in Clifford, C., U.S. Appl. No. 13/021,591, "Technique for Analyzing a Reflective Photo-Mask" filed Feb. 4, 2011.

Request for Continued Examination filed, Oct. 31, 2012, in Clifford, C., U.S. Appl. No. 13/021,591, "Technique for Analyzing a Reflective Photo-Mask" filed Feb. 4, 2011.

Office Action issued by U.S. Patent and Trademark Office, mailed Jun. 14, 2012, in Pang, U.S. Appl. No. 12/955,617, "Virtual Photo-Mask Critical-Dimension Measurement" filed Nov. 29, 2010.

Response to Office Action filed Oct. 15, 2012, in Pang, U.S. Appl. No. 12/955,617, "Virtual Photo-Mask Critical-Dimension Measurement" filed Nov. 29, 2010.

Notice of Allowance issued by U.S. Patent and Trademark Office, mailed Oct. 31, 2012, in Pang, U.S. Appl. No. 12/955,617, "Virtual Photo-Mask Critical-Dimension Measurement" filed Nov. 29, 2010.

Chen, C. Y. et al, "Mask defect auto disposition based on aerial image in mask product", Proc. SPIE 7379, 73791F (2009).

Pang, L., et al. "Full Chip Scale Source Mask Optimization (SMO) Implemented through Level Set Methods based Inverse Lithography Technology (ILT) Framework," Luminescent Litho Workshop 2009 Abstract, Apr. 29, 2009 vJM1.

Pang et al., "Considering MEEF in Inverse Lithography Technology (ILT) and Source Mask Optimization (SMO)" SPIE, vol. 7122, 14 pgs., (Oct. 17, 2008).

Rosenbluth et al., "Optimum Mask and Source Patterns to Print Given Shape", Apr. 2002, SPIE Proceedings vol. 4346, pp. 13-30.

Xiao et al., "Source Optimization and Mask Design to Minimize MEEF in Low $k_1$ Lithography" SPIE, vol. 7028, 11 pgs., (Jun. 9, 2008).

Issue Fee Payment and Comments on Statement for Reasons for Allowance filed Aug. 30, 2013, in Clifford, C., U.S. Appl. No. 13/021,591, "Technique for Analyzing a Reflective Photo-Mask" filed Feb. 4, 2011.

Office Action issued by USPTO, mailed Jun. 26, 2013, in Preil, Moshe E. et al., U.S. Appl. No. 12/440,722, "Photo-Mask and Wafer Image Reconstruction" filed Feb. 5, 2010.

\* cited by examiner

TECHNIQUE FOR REPAIRING A REFLECTIVE PHOTO-MASK

CROSS REFERENCE TO RELATED APPLICATIONS

This application is a continuation-in-part under 35 U.S.C. §120 of U.S. Non-provisional application Ser. No. 13/021,591 entitled "Technique for Analyzing a Reflective Photo-Mask," by Christopher Heinz Clifford, filed on Feb. 4, 2011, and claims the benefit of U.S. Provisional Application Ser. No. 61/382,857, filed Sep. 14, 2010, entitled "Technique for Analyzing a Reflective Photo-Mask," by Christopher Heinz Clifford, each of which are herein incorporated by reference.

BACKGROUND OF THE INVENTION

1. Field of the Invention

The present invention relates to techniques for repairing a photo-mask. More specifically, the invention relates to a technique for calculating a modification to a reflective photo-mask, which is to be used in a photolithographic process.

2. Related Art

Photolithography is a widely used technology for producing integrated circuits. In this technique, a light source illuminates a photo-mask. The resulting spatially varying light pattern is projected onto a photoresist layer on a semiconductor wafer by an optical system (which is referred to as an 'exposure tool'). By developing the 3-dimensional pattern produced in this photoresist layer (which is sometimes referred to as a 'target pattern'), a layer in the integrated circuit is created. Furthermore, because there are often multiple layers in a typical integrated circuit, these operations may be repeated using several photo-masks to produce a product wafer.

In order to appropriately scale to smaller critical dimensions in integrated circuits (and, thus, to reduce diffraction and proximity effects that occur when light is propagated through the optics of the exposure tool and is converted into the 3-dimensional pattern in the photoresist), commensurately smaller wavelengths of light may be provided by the light source. However, it is difficult to design and manufacture transmission photo-masks at small wavelengths, such as in the extreme ultra-violet.

Recently, reflective photo-masks have been investigated for use with wavelengths in the extreme ultra-violet. In a reflective photo-mask, a multilayer stack is used to reflect the light from the light source. For example, multiple alternating layers of silicon and molybdenum may be deposited on silicon or a glass substrate having an ultra-low thermal expansion coefficient (such as quartz). Then, the mask pattern may be defined in an absorption layer (such as tantalum nitride) that is deposited on top of the multilayer stack.

In practical reflecting photo-masks, up to 80 alternating layers are used. Furthermore, these layers may have thicknesses as small as 2-4 nm. However, this structure can be difficult to manufacture. For example, during the manufacturing process defects can occur throughout the multilayer stack. It can be difficult to detect the presence of a defect in the multilayer stack without performing destructive analysis. In addition, even if a defect is detected (or when a type of defect is probable in a given manufacturing process), it is often difficult (or impossible) to predict the consequences of the defect in the photolithographic process (e.g., will the defect result in an unacceptable change in the 3-dimensional pattern) or to determine how to modify a reflective photo-mask to reduce or eliminate the affect of a defect on the photolithographic process. As a consequence, the inspection and qualification criteria for reflective photo-masks are often needlessly conservative, which results in rejection of reflective photo-masks that could be successfully used in the photolithographic process (i.e., the reflective photo-mask yield may be needlessly reduced), thereby significantly increasing the cost of reflective photo-masks.

Hence, what is needed is a reflective photo-mask inspection and qualification technique that overcomes the problems listed above.

SUMMARY OF THE INVENTION

The present disclosure relates to a computer system for calculating a modification to a reflective photo-mask. During operation, the computer system aligns a mask pattern in a first image of the reflective photo-mask and a second image of the reflective photo-mask, where the first image and the second image correspond to different types of analysis techniques. Then, the computer system identifies a group of potential defects in the reflective photo-mask based on the aligned first and second images. Next, the computer system calculates the modification to the reflective photo-mask based on at least a subset of the group of potential defects using an inverse optical calculation. In particular, during the inverse optical calculation, a cost function at an image plane in a model of the photolithographic process is used to determine the modification to the reflective photo-mask at an object plane in the model of the photolithographic process. This cost function corresponds to a difference between a reference pattern associated with a target mask pattern and a calculated pattern associated with a modified reflective photo-mask. Note that the modified reflective photo-mask includes the modification to the reflective photo-mask determined in a previous iteration during the inverse optical calculation.

In some embodiments, the first image includes a contour of the mask pattern corresponding to a scanning-electron-microscope image of the mask pattern of the reflective photo-mask and the second image includes a profile of the reflective photo-mask corresponding to atomic-force-microscope image of the reflective photo-mask. Moreover, prior to aligning the first image and the second image, the computer system may extract the contour and may determine the profile.

Note that identifying the group of potential defects may involve calculating an aerial image at the image plane in the photolithographic process.

Furthermore, the inverse optical calculation may include a constrained inverse optical calculation in which the modification is restricted to discrete values, such as those corresponding to an etching step size and an etching pixel size and/or a deposition step size and a deposition pixel size used when modifying the reflective photo-mask. For example, in some embodiments only etching is allowed or etching is preferred to deposition. Alternatively or additionally, deposition accuracy (in terms of deposition pixel size and the deposition step size) is looser than the etching accuracy (i.e., the deposition pixel size is larger than the etching pixel size and/or the deposition step size is larger than the etching step size).

In some embodiments, the reference pattern includes a reference aerial image at the image plane and the calculated pattern includes an aerial image at the image plane. Alternatively or additionally, the reference pattern may include a reference contour at the image plane and the calculated pattern may include a contour at the image plane.

Moreover, the reference pattern and the calculated pattern may correspond to a set of process conditions during the photolithographic process, such as different focal conditions and/or different exposure latitudes. In these embodiments, the cost function may include different weights for different process conditions in the set of process conditions.

In some embodiments, after calculating the modification, the computer system modifies the reflective photo-mask based on the calculated modification. Note that this operation may include providing instructions to a user or a photo-mask repair system. Moreover, modifying the reflective photo-mask may involve etching the reflective photo-mask and/or depositing a material on the reflective photo-mask. Additionally, prior to modifying the reflective photo-mask, the computer system may decompose the modification into an etching modification to the reflective photo-mask and a deposition modification to the reflective photo-mask.

Note that the modification may include a modification to the mask pattern in an absorption layer in the reflective photo-mask.

In some embodiments, after identifying the group of potential defects and prior to calculating the modification, the computer system determines the subset of the group of potential defects that modify a wafer pattern to be produced using the reflective photo-mask in the photolithographic process.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 1:
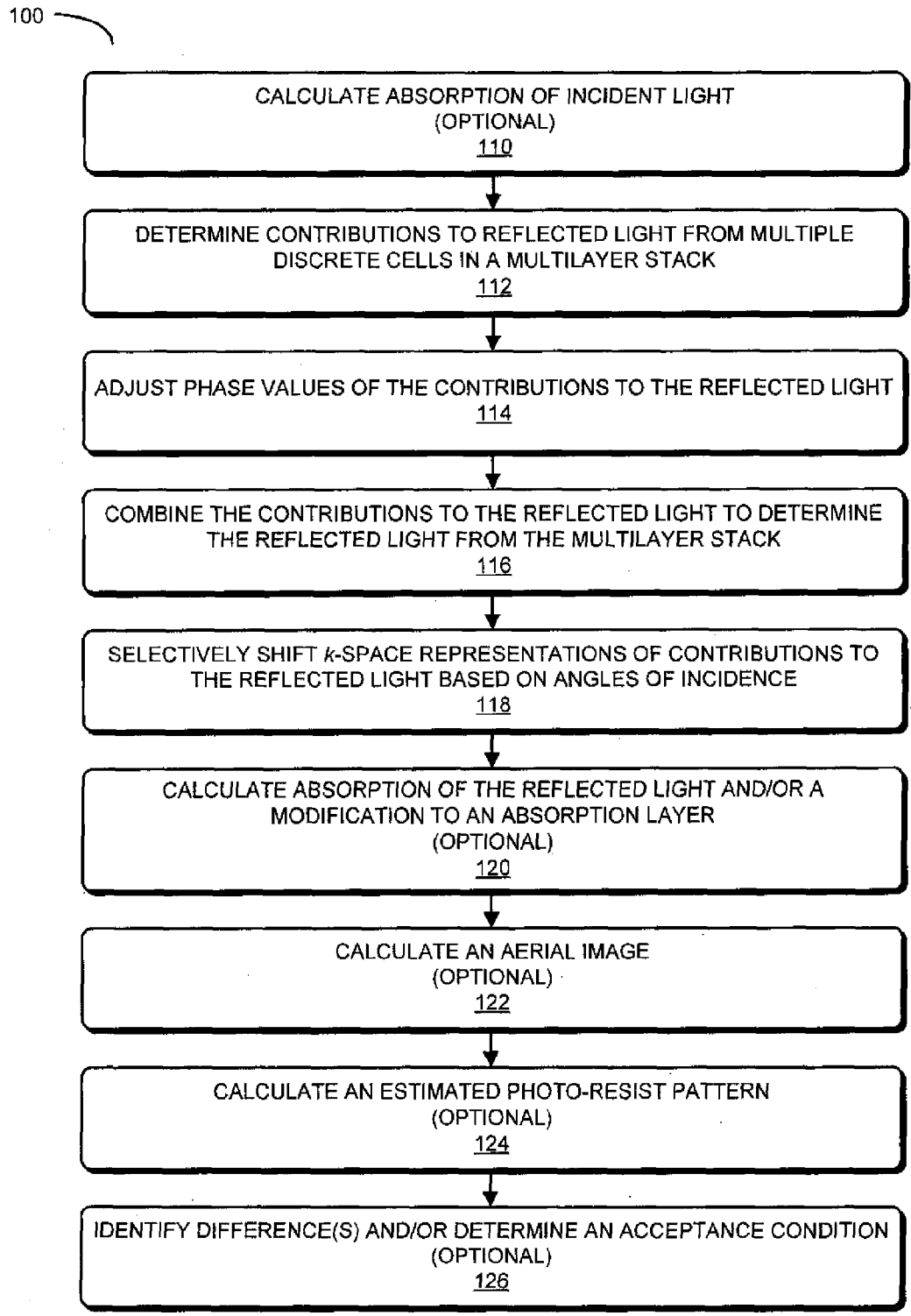
FIG. 1 is a flow chart illustrating a method for calculating reflected light from a multilayer stack in a reflective photo-mask in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These devices and processes may be used to calculate a modification to a reflective photo-mask, which, in turn, can be used to modify or repair one or more defects in the reflective photo-mask. In particular, using information associated with different types of analysis techniques (such as a contour of a mask pattern in the reflective photo-mask that is determined from a scanning-electron-microscope image and a profile of the reflective photo-mask that is determined from an atomic-force-microscope image), a group of one or more potential defects in the reflective photo-mask is determined. Then, the modification to the reflective photo-mask is calculated based on at least a subset of the group of potential defects using an inverse optical calculation. In particular, during the inverse optical calculation, a cost function at an image plane in a model of the photolithographic process is used to determine the modification to the reflective photo-mask at an object plane in the model of the photolithographic process. This cost function may correspond to a difference between a reference pattern associated with a target mask pattern (such as a reference aerial image or a reference contour at an image plane in the photolithographic process) and a calculated pattern associated with a modified reflective photo-mask (such as an aerial image or a contour at the image plane in the photolithographic process). Note that the modified reflective photo-mask may include the modification to the reflective photo-mask determined in a previous iteration during the inverse optical calculation.

This calculation technique may provide a fast and accurate approach for calculating the reflected light from the multilayer stack. As a consequence, it may be useful in assessing the impact of one or more defects in the multilayer stack in the photolithographic process. For example, the calculated reflected light from the multilayer stack may be used to determine an aerial image at an image plane of an optical path associated with the photolithographic process (such as the aerial image at a wafer in a exposure tool) and/or an estimated resist pattern. Furthermore, for a given defect, the impact in the aerial image and/or the estimated resist pattern may be determined with different mask patterns to assess which mask patterns can be used with a multilayer stack that includes the given defect, as well as to determine how to modify the reflective photo-mask to repair the given defect. Therefore, the calculation technique may be used to determine an acceptance condition of the reflective photo-mask and/or how to repair the reflective photo-mask, which may allow improved inspection and qualification criteria for reflective photo-masks, with a commensurate impact on reflective-photo-mask yield and cost.

In the discussion that follows, a reflective photo-mask should be understood to include an absorption layer, an alternating phase-shift layer, and/or an attenuating phase-shift layer deposited on a multilayer stack, which in turn is deposited on a substrate. This reflective photo-mask may be used in extreme ultra-violet photolithography. Furthermore, the reflective photo-mask may be used in multiple-exposure photolithography, where patterns printed on a wafer or semiconductor die using two or more reflective photo-masks are combined to produce a desired or target pattern, such as a portion of an integrated circuit. Furthermore, a mask pattern should be understood to include the pattern of spatially varying transmittance magnitude and/or transmittance phase of the absorption layer, the alternating phase-shift layer, and/or the attenuating phase-shift layer deposited on the multilayer stack. Note that, typically, the manufactured or fabricated mask pattern in a given reflective photo-mask may deviate from an ideal target mask pattern, for example, because of defects that can occur during the photo-mask fabrication process. In addition, as described further below, there may be defects in the multilayer stack.

In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these files may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

We now describe embodiments of the calculation technique. FIG. 1 presents a flow chart illustrating a method 100 for calculating reflected light from a multilayer stack in a reflective photo-mask (such as a reflective photo-mask for use in an extreme ultra-violet range of wavelengths), which is performed by a computer system (such as computer system 600 in FIG. 6). During operation, the computer system determines contributions to reflected light from multiple discrete cells in a model of the multilayer stack in the reflective photo-mask based on angles of incidence of light in a light pattern to the multilayer stack, a polarization of the light in the light pattern, and a varying intensity of the light in the light pattern through the multilayer stack (operation 112), where the multiple discrete cells are at horizontal and vertical positions in the multilayer stack, and where the multilayer stack includes at least one defect. Then, the computer system adjusts phase values of the contributions to the reflected light from the multiple discrete cells (operation 114), thereby specifying optical path differences between the multiple discrete cells in the multilayer stack that are associated with the defect. Moreover, the computer system combines the contributions to the reflected light from multiple discrete cells to determine the reflected light from the multilayer stack (operation 116). Next, the computer system selectively shifts k-space representations of the contributions to the reflected light from the multiple discrete cells based on the angles of incidence (operation 118), thereby accounting for phase variations associated with deviations from normal incidence. Note that this approach to handling the variations in the normal orientation may result in a reasonable tradeoff between the speed and the accuracy of the calculation technique (for example, the calculation technique may be four to five-times faster than existing reflected-light calculation techniques, and the accuracy may be 4% for incident light having an angle of incidence up to 9°).

Note that the horizontal and vertical positions may be included in horizontal planes (e.g., x, y planes) in the multilayer stack that are separated by a spacing or a height z. In these embodiments, deviations in vertical positions within the multilayer stack that are associated with the defect may be addressed using the phase values. Furthermore, determining the reflected light from a given discrete cell in the multiple discrete cells may use a closed-form expression for the reflected light. For example, the closed-form expression may treat the given discrete cell as an infinite two-dimensional sheet in the multilayer stack.

In some embodiments, the defect is associated with vertical displacements and/or a change in a thickness of one or more layers in a region in the multilayer stack. More generally, the defect may include a deviation in a magnitude and/or a phase of the reflectance of the reflective photo-mask from that associated with reflective photo-mask that excludes the defect, and which has a target mask pattern defined on its top surface. Thus, the defect may include a hard defect (such as a sputtering-induced bump in at least some of the layers in the multilayer stack), an error in the mask pattern, and/or a soft defect (such as dirt or contamination on the surface of the reflective photo-mask).

Additionally, for a given discrete cell, the varying intensity of the light pattern through the multilayer stack may involve calculating cumulative reflection and absorption by intervening discrete cells between the given discrete cell and a top surface of the multilayer stack.

In some embodiments, prior to determining the contributions to the reflected light from the multiple discrete cells, the computer system optionally calculates absorption of incident light to the reflective photo-mask by an absorption layer in the model (operation 110), which is deposited on the multilayer stack in the reflective photo-mask, thereby determining the light pattern incident to the multilayer stack, where the absorption layer includes a mask pattern of the reflective photo-mask. Note that the incident light may be represented by a plane wave and/or the light pattern may include a near-field diffraction pattern associated with the mask pattern. Furthermore, after combining the contributions to the reflected light from multiple discrete cells, the computer system may optionally calculate absorption of the reflected light from the reflective photo-mask by the absorption layer (operation 120), thereby calculating reflected light from the reflective photo-mask. In some embodiments, the computer system calculates a modification to the multilayer stack based on the defect (operation 120). For example, the computer system may change a thickness of the absorption layer and/or may modify a two-dimensional pattern of the absorption layer (which collectively are sometimes referred to as 'multilayer defect compensation').

Additionally, the computer system may optionally calculate an aerial image at an image plane of an optical path in a photolithographic process using a forward optical calculation based on the reflected light from the reflective photo-mask, information about the optical path in the photolithographic process and conditions associated with the photolithographic process (operation 122). For example, the forward optical calculation may be based on the information about the optical path associated with an imaging system (such as an exposure tool) that is used in the photolithographic process. Note that the conditions associated with the photolithographic process may include: immersion optics, a source pattern (for example, an annular, quadrupole, disk illumination with a sigma of 0.75, and/or a pixilated source pattern), a numerical aperture of 0.32 or 0.67, a wavelength of 260 nm, etc.

In some embodiments, the computer system optionally calculates an estimated resist pattern based on the aerial image and a model of a photoresist (such as a model of a positive or a negative resist) in the photolithographic process (operation 124). Note that one or more aerial images and/or estimated photoresist patterns may be determined using a variety or a range of imaging conditions, such as: different wavelengths, different focal conditions, different illumination types (such as annular, quadrupole, immersion, etc.), etc. Furthermore, the computer system may optionally identify differences between the estimated resist pattern and a target pattern (or differences between the aerial image and the target pattern), and/or the computer system may optionally determine an acceptance condition of the reflective photo-mask based on the identified differences (operation 126).

For example, a photo-mask qualifier may analyze the aerial image and/or the estimated resist pattern to determine if it is acceptable, e.g., if differences with respect to the target pattern and/or any deviations that are present are within acceptable bounds, such as a fraction of a critical dimension in the target pattern. (In embodiments where the aerial image is used instead of the estimated photoresist pattern, this may involve prior correlation with the critical dimension(s) of a test wafer.) If yes, the reflective photo-mask may be accepted, and if not, the reflective photo-mask may be: rejected, subject to rework, or subject to additional qualification testing.

In some embodiments, the reflective photo-mask is accepted (or not) based on a process window (such as a range of exposure times, a depth of focus, a range of exposure intensities, and/or a normalized image log slope) associated with the photolithographic process. In this way, a particular defect that is fatal when slightly overexposed may be identified, even though it is negligible at the nominal dose. In addition, in some embodiments the reflective photo-mask is accepted (or not) based on features in the aerial image and/or the estimated resist pattern that are identified over or throughout the process window and/or based on an impact on a critical dimension across the process window. Note that acceptance of the reflective photo-mask may be fully automated, while in other embodiments it may not be fully automated. Thus, information (such as identified differences or features) may be presented to an operator, who may verify an acceptance recommendation made by the computer system (such as a reflective photo-mask inspection and qualification system) or who may independently determine whether or not to accept the reflective photo-mask.

Alternatively or additionally, the reflective photo-mask may be qualified based on comparisons between the estimated resist pattern and actual patterned wafer patterns produced or generated using a reflective photo-mask. For example, a wafer-exposure system (such as a photolithographic exposure tool) may be used to produce a printed wafer using the reflective photo-mask, and a printed wafer image of the pattern on the printed wafer may be determined using a wafer-imaging system (such as the PUMA™ patterned wafer-inspection platform from KLA-Tencor, Inc., of San Jose, Calif.). However, this brute-force approach is often expensive and time consuming. In addition, errors introduced in the photolithographic process in the wafer-exposure system may reduce the accuracy of the qualification decision made by the computer system.

Thus, the calculation technique may overcome the limitations in existing reflective photo-mask inspection and qualification, for example, by providing a low-cost and efficient technique for determining whether or not a reflective photo-mask (including any defects) is acceptable. Therefore, the calculation technique may improve reflective photo-mask and/or wafer yield, and thus may decrease the cost and time to market of reflective photo-masks and integrated circuits.

In some embodiments of method 100 there may be additional or fewer operations. Moreover, the order of the operations may be changed, and/or two or more operations may be combined into a single operation. For example, in some embodiments ray tracing is used to account for the divergence or spreading of contributions to the reflected light that are associated with at least the defect. Furthermore, in some embodiments horizontal sampling (such as the size of the discrete cells in a horizontal plane) across the multilayer stack is varied based on a relative position with respect to at least the defect so that the horizontal sampling is increased in proximity to the defect and is decreased distal from the defect. Thus, coarse and fine horizontal sampling may be used in the calculation technique.

Figure 2A:
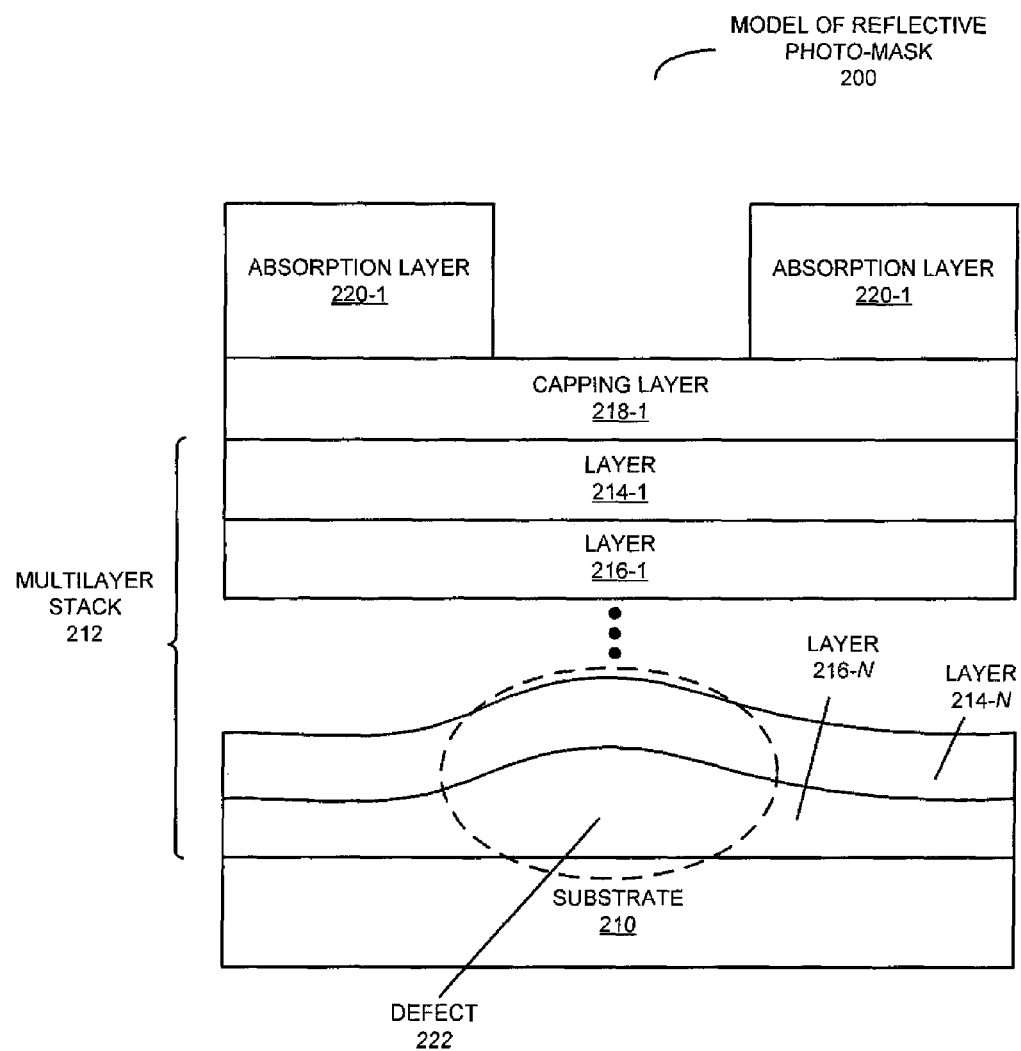
FIG. 2A is a block diagram illustrating a model of a reflective photo-mask in accordance with an embodiment of the present invention.

In an exemplary embodiment, the calculation technique is used to determine the reflected light from a model of a reflective photo-mask that includes at least one defect. This is shown in FIG. 2A, which presents a block diagram illustrating a model of a reflective photo-mask 200. In this model of reflective photo-mask 200, a multilayer stack 212 is deposited on a substrate 210 (such as silicon or quartz). Note that multilayer stack 212 includes alternating layers 214 and 216. For example, these layers may, respectively, include silicon and molybdenum, and may, respectively, have thicknesses of 4 nm and 2 nm. In some embodiments, there are 40 instances of alternating layers 214 and 216 (or 80 layers in total). Note that in the model, each of layers 214 and 216 may be subdivided into multiple discrete cells (not shown).

Furthermore, a capping layer 218 (such as ruthenium) may be deposited onto multilayer stack 212. Additionally, an absorption layer 220-1 (such as tantalum nitride) may be deposited on top of capping layer 218, and this absorption layer 220-1 may be patterned (for example, using electron-beam lithography) to define the two-dimensional mask pattern.

The model of reflective photo-mask 200 may include a defect 222, such as one associated with a fabrication process. For example, the model of reflective photo-mask 200 may correspond to a reflective photo-mask that is fabricated using a sputtering process, and a buried defect, such as a 'bump' or change in vertical position, may occur between substrate 210 and multilayer stack 212 and/or between layers in multilayer stack 212. In some embodiments, defect 222 has a height of 15 nm, which results in a 1.5 nm vertical deviation or displacement at a surface of multilayer stack 212.

Note that defect 222, whose impact on the aerial image and/or the estimated photo-resist pattern is to be studied using the calculation technique, may be identified in a reflective photo-mask (for example, using micro-analysis) or it may be known that a manufacturing process used to fabricate the reflective photo-mask may be vulnerable to a type of defect, such as defect 222.

In some embodiments, the reflected light associated with the model of reflective photo-mask 200, the aerial image, and/or the estimated photo-resist pattern are calculated for a set of mask patterns. In this way, one or more mask patterns that are compatible with or that can be used safely with a particular mask pattern in a reflective photo-mask corresponding to the model of reflective photo-mask 200, e.g., mask patterns that result in acceptable aerial images and/or estimated photo-resist patterns, can be identified. Alternative, such calculations can be used to identify which reflective photo-masks may require remedial action (such as repair or rework) if a defect, such as defect 222, occurs.

In an exemplary embodiment, after calculating absorption of incident light (such as a plane wave) by absorption layer 220-1, the Fourier transform of a near-field diffraction pattern associated with the two-dimensional mask pattern is used to calculate the contributions to the reflected light. In particular, the reflection by each discrete cell in multilayer stack 212 may be calculated using a closed-form expression that assumes each discrete cell is an infinite two-dimensional sheet (which is sometimes referred to as a 'parallel segments' model). However, other models, such as a finite difference time domain model, may be used. Then, the calculated contributions are summed to generate the Fourier transform of a near-field diffraction pattern reflected from multilayer stack 212. Next, absorption of this reflected light by absorption layer 220-1 is calculated, and the resulting reflect light from the model of reflecting photo-mask 200 is used in a lithographic simulator to determine one or more aerial images and/or estimated photo-resist patterns.

Figure 2B:
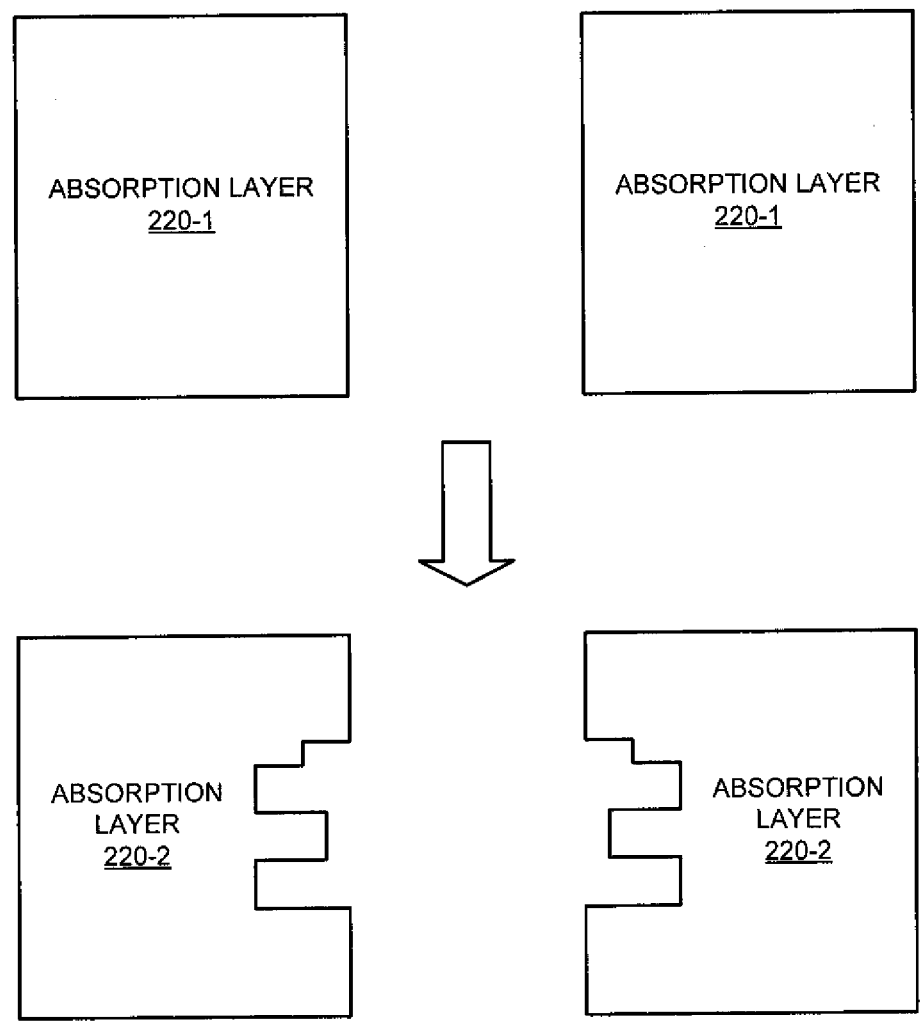
FIG. 2B is a block diagram illustrating a top view of multilayer defect compensation of an absorption layer in a reflective photo-mask in accordance with an embodiment of the present invention.

As noted previously, in some embodiments a modification to the multilayer stack is calculated based on the defect, such as a change in a thickness of absorption layer 220-1 and/or may modify a two-dimensional pattern of absorption layer 220-1. This is shown in FIG. 2B, which presents a block diagram illustrating a top view of multilayer defect compensation of an absorption layer in a reflective photo-mask. In particular, using a forward optical calculation (such as that described in FIG. 3) and/or an inverse optical calculation (in which a desired output, such as a target pattern on a wafer is used to determine the modification to the absorption layer based on an intervening optical path in a photolithographic process), one or more edges of absorption layer 220-1 may be displaced to generate absorption layer 220-2. Alternatively or additionally, the thickness of absorption layer 220-1 may be changed in at least a region of the reflective photo-mask. In general, the modifications to absorption layer 220-2 may correct for or reduce the impact of a defect (such as defect 222 in FIG. 2A) on a resulting wafer pattern (such as the impact on a critical dimension or a threshold of a line) that is fabricated in a photolithographic process.

In an exemplary embodiment, absorption layer 220-1 has 88 nm dense lines (on the reflective photo-mask) and the light has a 6° angle of incidence. Furthermore, defect 222 (FIG. 2A) may be 3 nm tall and may have a 65 nm full-width at half maximum. As shown in FIG. 2A, defect 222 may be a defect on substrate 210, which results in vertical displacements of subsequent layers up to a surface of the reflective photo-mask. These vertical displacements may be centered 22 nm (on the reflective photo-mask) from an edge of absorption layer 220-1. Furthermore, the vertical displacements may be uniform from substrate 210 (FIG. 2A) to the surface of the reflective photo-mask. Note that this reflective photo-mask may be used in a photolithographic process characterized by a numerical aperture of 0.32 and a source pattern with a sigma of 0.75.

Figure 3:
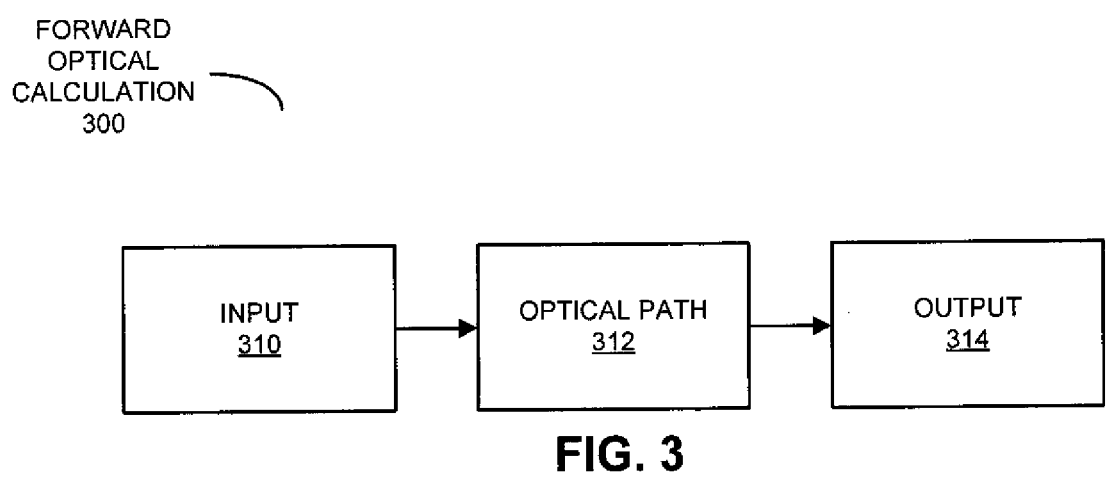
FIG. 3 is a block diagram illustrating a forward optical calculation in accordance with an embodiment of the present invention.

FIG. 3 presents a block diagram illustrating a forward optical calculation 300. In this calculation, the reflected light (such as the reflected light provided by a reflective photo-mask when illuminated by a source pattern) is used as an input 310 at an object plane of optical path 312 to determine a predicted output 314 (such as a pattern or an image) at an image plane of optical path 312. For example, using the calculated reflected light from the reflective photo-mask (which is illuminated by a source pattern) and information about the optical path in an exposure tool, the aerial image can be determined.

Figure 4:
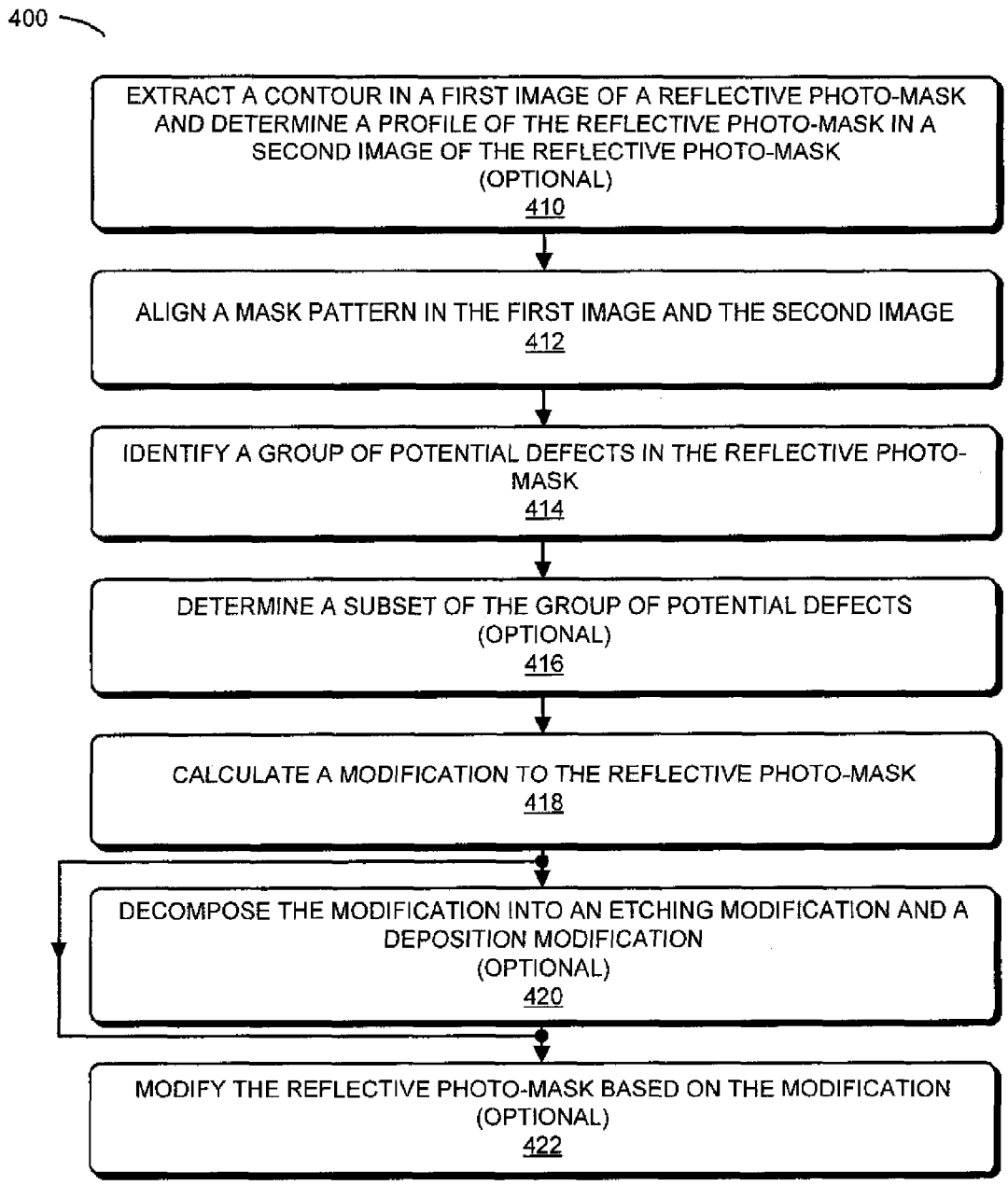
FIG. 4 is a flow chart illustrating a method for calculating a modification to a reflective photo-mask in accordance with an embodiment of the present invention.

We now describe another embodiment of the calculation technique. FIG. 4 presents a flow chart illustrating a method 400 for calculating a modification to a reflective photo-mask, which is performed by a computer system (such as computer system 600 in FIG. 6). During operation, the computer system aligns a mask pattern in a first image of the reflective photo-mask and a second image of the reflective photo-mask (operation 412), where the first image and the second image correspond to different types of analysis techniques. For example, the first image may include a contour of the mask pattern corresponding to a scanning-electron-microscope image of the mask pattern of the reflective photo-mask and the second image may include a profile of the reflective photo-mask corresponding to atomic-force-microscope image of the reflective photo-mask. Moreover, prior to aligning the first image and the second image, the computer system may optionally extract the contour and may determine the profile (operation 410). In particular, a 3-dimensional profile may be obtained by extrapolating and subtracting a profile of the blank from a profile of the blank, the multilayer stack and the absorption layer.

Then, the computer system identifies a group of potential defects in the reflective photo-mask based on the aligned first and second images (operation 414). Note that identifying the group of potential defects may involve calculating an aerial image at the image plane in the photolithographic process. This may involve a forward optical calculation, such as that illustrated in FIG. 3. In some embodiments, after identifying the group of potential defects and prior to calculating the modification, the computer system optionally determines a subset of the group of potential defects that modify a wafer pattern to be produced using the reflective photo-mask in the photolithographic process (operation 416). For example, the subset may be those potential defects that 'print' or modify an aerial image or a wafer pattern at an image plane in the photolithographic process.

Next, the computer system calculates the modification to the reflective photo-mask (such as a modification to the mask pattern in an absorption layer in the reflective photo-mask) based on at least the subset of the group of potential defects using an inverse optical calculation (operation 418). In particular, during the inverse optical calculation, a cost function at an image plane in a model of the photolithographic process is used to determine the modification to the reflective photo-mask at an object plane in the model of the photolithographic process. This cost function corresponds to a difference between a reference pattern associated with a target mask pattern and a calculated pattern associated with a modified reflective photo-mask. For example, the cost function may include a magnitude of the difference to the nth power (such as the magnitude squared), where n can be a real number. Note that the modified reflective photo-mask includes the modification to the reflective photo-mask determined in a previous iteration during the inverse optical calculation.

Furthermore, the inverse optical calculation may include a constrained inverse optical calculation in which the modification is restricted to discrete values, such as those corresponding to an etching step size and an etching pixel size and/or a deposition step size and a deposition pixel size used when modifying the reflective photo-mask. Note that the constrained inverse optical calculation may be 'biased' to prefer an etching modification over a deposition modification to the reflective photo-mask. For example, in some embodiments only etching is allowed or etching is preferred to deposition. Alternatively or additionally, deposition accuracy (in terms of deposition pixel size and the deposition step size) is looser than the etching accuracy (i.e., the deposition pixel size is larger than the etching pixel size and/or the deposition step size is larger than the etching step size).

In some embodiments, the reference pattern includes a reference aerial image at the image plane and the calculated pattern includes an aerial image at the image plane. (Thus, the cost function may correspond to the difference of at least two aerial images.) Alternatively or additionally, the reference pattern may include a reference contour at the image plane and the calculated pattern may include a contour at the image plane.

Moreover, the reference pattern and the calculated pattern may correspond to a set of process conditions during the photolithographic process, such as different focal conditions and/or different exposure latitudes. In these embodiments, the cost function may include different weights for different process conditions in the set of process conditions. For example, the nominal focus and/or exposure latitude may have a weight of 1, while other process conditions may have smaller weights.

In some embodiments, prior to modifying the reflective photo-mask, the computer system may optionally decompose the modification into an etching modification to the reflective photo-mask and a deposition modification to the reflective photo-mask (operation 420). Additionally, after calculating the modification, the computer system optionally modifies the reflective photo-mask based on the calculated modification (operation 422). Note that this operation may include providing instructions to a user (who performs the modification) and/or a photo-mask repair system (which performs the modification). For example, the photo-mask repair system may include an electron-beam repair tool provided by Carl Zeiss AG (of Oberkochen, Germany). Moreover, modifying the reflective photo-mask may involve etching the reflective photo-mask and/or depositing a material on the reflective photo-mask.

In some embodiments, the computer system may generate a target scanning-electron-microscope image based on the target mask pattern. Moreover, a scanning-electron-microscope image may be generated based on the modified reflective photo-mask (which includes the modification), and the two scanning-electron-microscope images may be compared.

In some embodiments of method 400 there may be additional or fewer operations. Moreover, the order of the operations may be changed, and/or two or more operations may be combined into a single operation.

Figure 5:
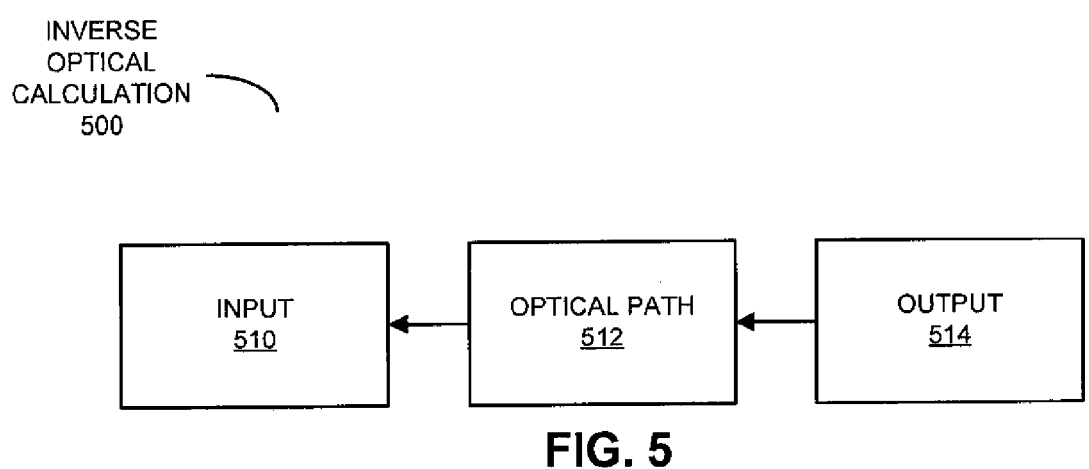
FIG. 5 is a block diagram illustrating an inverse optical calculation in accordance with an embodiment of the present invention.

FIG. 5 presents a block diagram illustrating an inverse optical calculation 500. In this calculation, a predicted input 510 (such as a predicted modified mask pattern in the reflective photo-mask) at an object plane of optical path 512 is determined based on an output 514 (such as a target wafer pattern or the cost function) at an image plane of optical path 512. For example, the modified mask pattern at the object plane may be determined from the cost function at the image plane and information about the optical path in an exposure tool. Note that information about optical path 512 may include the characteristic of optical path 512, such as an optical bandwidth of optical path 512.

While the preceding discussion illustrates the inverse optical calculation using a single output 514, in other embodiments multiple patterns or images at image plane(s) of optical path 512 may be used. For example, instead of the calculated pattern, there may be a set of calculated patterns that are each determined using different wavelengths, different focal conditions (e.g., on different focal surfaces or planes), and/or different imaging conditions in the exposure tool. These patterns may include magnitude and/or phase information. Furthermore, in some embodiments each of the patterns at the image plane(s) used in the inverse optical calculation 500 or a term(s) including some combination of the patterns at the image plane(s) may be multiplied by a corresponding weight. In this way, inverse optical calculation 500 may emphasize one or more of the patterns at the image plane relative to other patterns (at the same or other image planes) used in inverse optical calculation 500.

In some embodiments, inverse optical calculation 500 is based on iterative minimization of a cost function (H), which is also sometimes referred to as an 'error function' or a 'Hamiltonian function.' In particular, during each iteration of inverse optical calculation 500 the cost function may be a function of the difference between output 514 and a pattern (or image) that results when input 510 is projected through optical path 512. In some embodiments, input 510 initially corresponds to the target mask pattern, and as the calculation progresses this pattern is allowed to evolve while output 514 is held constant (subject to the constraints that there are a finite number of discrete steps sizes or pixel sizes).

In embodiments with multiple patterns (or images) at object plane(s) and/or image plane(s), the cost function (H) equals $$\sum_{j=1}^{N} w_j |I_j - I_{oj}|^n,$$

where $I_j$ is the forward projection of the jth modified mask pattern at the object plane (out of N patterns in this example) through optical path 512, $w_j$ is a corresponding weight, $I_{oj}$ is the jth target image at an image plane, and n is a power. Note that the cost function (H) approaches zero as $I_j$ approaches $I_{oj}$.

In an exemplary embodiment, N is 3 and n is 2. Three patterns (or patterns) at the image plane(s) may be determined at three different focal conditions (or focus settings) in the exposure tool. For example, with a wavelength of 260 nm, the focal conditions may be at −600 nm (relative to nominal focus), at 0 nm (i.e., at nominal focus), and 600 nm (relative to nominal focus). Alternatively or in addition, the three patterns (or images) at the image plane(s) may be determined at three different wavelengths or imaging conditions. Furthermore, a corresponding set of weights $\{w_j\}$ may be 1, 0.1, and 1.

In other embodiments, the weights are varied as inverse optical calculation 500 progresses and/or different weights are used for specific parts (or even pixels) of a pattern. For example, the weights may be determined based on the difference between $I_j$ and $I_{oj}$ at a given step or iteration in inverse optical calculation 500. This approach may exaggerate the features or defects, especially when inverse optical calculation 500 is close to a local or global minimum and the cost function (H) corresponds to small differences. Thus, in general the cost function (H) may be expressed as a double integral over the pattern or image area and there may be separate time-dependent weights for $I_j$ and $I_{oj}$. Furthermore, in some embodiments the cost function (H) is expressed as a relative difference between $I_j$ and $I_{oj}$ for at least a portion of inverse optical calculation 500 as it progresses.

It will be recognized by one of ordinary skill in the art that inverse optical calculation 500 described above is poorly defined. In particular, numerous possible modified mask patterns at the object plane may result from the same observed output 514. Therefore, input 510 may be selected such that it is 'most likely' to represent the target mask pattern. A variety of constraints and additional criteria may be imposed when determining the solution(s) to this problem in order to find a unique answer(s). For example, input 510 may be that which has the smallest value of the cost function (H).

Note that optical path 512 may be different than optical path 312 (FIG. 3). In general, information about optical paths 312 (FIG. 3) and/or 512 may include some or all of the aspects of the photolithographic process, such as: illumination settings, the electromagnetics of the photo-mask, the exposure-tool optics, etc. In addition, in some embodiments forward optical calculation 300 (FIG. 3) and/or inverse optical calculation 500 model the effect of a photoresist, including flare and/or etch effects.

The calculations corresponding to one or more optical paths in forward optical calculation 300 (FIG. 3) and/or inverse optical calculation 500 may be implemented using Fourier-optical techniques. Furthermore, the optical path in forward optical calculation 300 and/or inverse optical calculation 500 may include multiple models of optical paths (such as in a multiple-exposure photolithographic process). Also note that while optical path 312 (FIG. 3) and optical 512 have, respectively, been traversed in a particular direction, these optical paths may be traversed in either direction.

Furthermore, note that forward optical calculation 300 (FIG. 3) and/or inverse optical calculation 500 may take into account, by way of example but not limitation, various illumination conditions (e.g., off-axis, incoherent), the actual electromagnetics of the light field interacting with the reflective photo-mask, aberrations in optical paths 312 (FIG. 3) and/or 512, and/or the vector nature of the electromagnetic field as it propagates through optical paths 312 (FIG. 3) and/or 512. In some embodiments, aspects of forward optical calculation 300 in FIG. 3 (such as the mask pattern) and/or inverse optical calculation 500 are represented using one or more level-set functions. Furthermore, in some embodiments, forward optical calculation 300 and/or inverse optical calculation 500 are divided into a series of overlapping sub-problems (also referred to as 'work units'), at least some of which are processed independently and/or concurrently. These work units may be based on elements or structures (for example, repetitive structures) in the mask pattern and/or the target pattern. For example, the work units may be between 10,000 nm$^2$ and 100 µm$^2$ in size.

We now describe an exemplary embodiment of the forward optical calculation or forward projection operation used to calculate the aerial image, the contour and/or the estimated resist pattern. For simplicity, coherent illumination of the reflective photo-mask is utilized. Furthermore, the electric field falling upon the reflective photo-mask is approximately constant. Thus, the clear regions of the reflective photo-mask reflect the light, while the opaque regions absorb the light. It follows that a scalar electric field E illuminating the reflective photo-mask may be expressed as $$E(\vec{r}) = \begin{cases} 0 & \text{absorption} \\ 1 & \text{non-absorption} \end{cases},$$

where $\vec{r} = (x, y)$ is a point on the (x, y) plane. In some embodiments, this representation of the reflective photo-mask may be re-expressed using a function φ (referred to as a level-set function) having positive regions that indicate absorption regions and negative regions that indicate non-absorption regions. (More generally, the level-set function may represent the reflective photo-mask using two or more levels.) Furthermore, the level-set function may equal zero at the boundaries or contours of the reflective photo-mask. Therefore, the electric field E associated with the reflective photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{cases} 1 & x \geq 0 \\ 0 & x < 0 \end{cases}.$$

Since an ideal diffraction limited lens acts as a low-pass filter, this may be used as an approximation to the actual (almost but not quite perfect) lens in the optical path of the exposure tool (in this example). Mathematically, the action of the lens may be expressed as $$A(\vec{r}) = f^{-1}(\hat{C}(f(E(\vec{r}))))$$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the lens, and one otherwise. Thus, the pupil function is $$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases},$$

wherein $k_x$, $k_y$ and $k_{max}$ represent frequency coordinates in Fourier space. Therefore, the aerial image (at the wafer in the exposure tool) is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2).$$

This is a self-contained formula for the aerial image obtained by the exposure tool.

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the reflective photo-mask, various types of reflective photo-masks, the polarization of the light field, the actual properties of the lens (such as aberrations), and/or the vector nature of the electromagnetic field as it propagates through the optical path.

In some embodiments, during each iteration of inverse optical calculation 500 the level-set function corresponding to input 510 being modified is updated according to $$\phi_{i+1} = \phi_i + \Delta t \cdot \nabla(H),$$

where $\phi_{i+1}$ is an updated version of the level-set function, $\phi_i$ is the current version of the level-set function, Δt is a step size in the calculation and ∇(H) is a gradient or a derivative of the cost function. In an exemplary embodiment, ∇(H) is $$\left.\frac{\delta H}{\delta \phi}\right|_{\varphi_i},$$

i.e., it is the Frechet derivative of the cost function H. Furthermore, in some embodiments ∇(H) is the direction of steepest descent for minimizing or optimizing H by changing φ. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse optical calculation 500. In particular, the cost function H may be allowed to increase during some steps as the calculation evolves. In this way, the global minimum in the multi-dimensional space may be determined. Note that the size of this multi-dimensional space may be a number of quantization levels to the power of the number of pixels in the modified mask pattern. In an exemplary embodiment, the modified mask pattern or image has at least 1 million pixels (for example, 1024×1024).

In one embodiment, in any iteration of inverse optical calculation 500, changes in φ that decrease or increase the cost function (H) up to 0.5% are performed. If a larger change will result (e.g., ΔH>0.5%), the step size Δt may be decreased by a factor that is at least greater than 1 and the change in φ is implemented (or not) based on a probability and a value P given by $$e^{\frac{-kH_{i+1}}{H_i}},$$

where $H_{i+1}$ is the cost function in the $i+1^{th}$ iteration (if the change in φ is implemented) and $H_i$ is the cost function in $i^{th}$ iteration (note that the ratio of $H_{i+1}/H_i$ equals 1+ΔH). In some embodiments k is 0.155. For example, if the value P is 0.3 and the probability is a random (or pseudorandom) number between 0 and 1 that is less than P, the cost function may be increased before proceeding. In this way, inverse optical calculation 500 initially takes large steps and thereby explores the solution space.

In some embodiments, inverse optical calculation 500 is run for 100, 1000 or 10,000 iterations at which point the optimal solution has been determined. In other embodiments, the calculation is stopped based on convergence criteria, such as oscillatory behavior, a relative and/or absolute difference between the inspection image and images that result when the reconstructed mask pattern is projected through optical path 512, the latest change to the cost function H, and/or the history of changes to the cost function H. For example, the relative difference may be less than 1% and/or the absolute difference may be 10 nm for a critical dimension of 100 nm. Note that in some embodiments, the level-set function is re-distanced (i.e., restored to one having a distance function property relative to an edge or contour in the mask pattern) at intermediate iterations during inverse optical calculation 500. In an exemplary embodiment, such re-distancing occurs at least every 20 iterations (for example, every 14 iterations).

Figure 6:
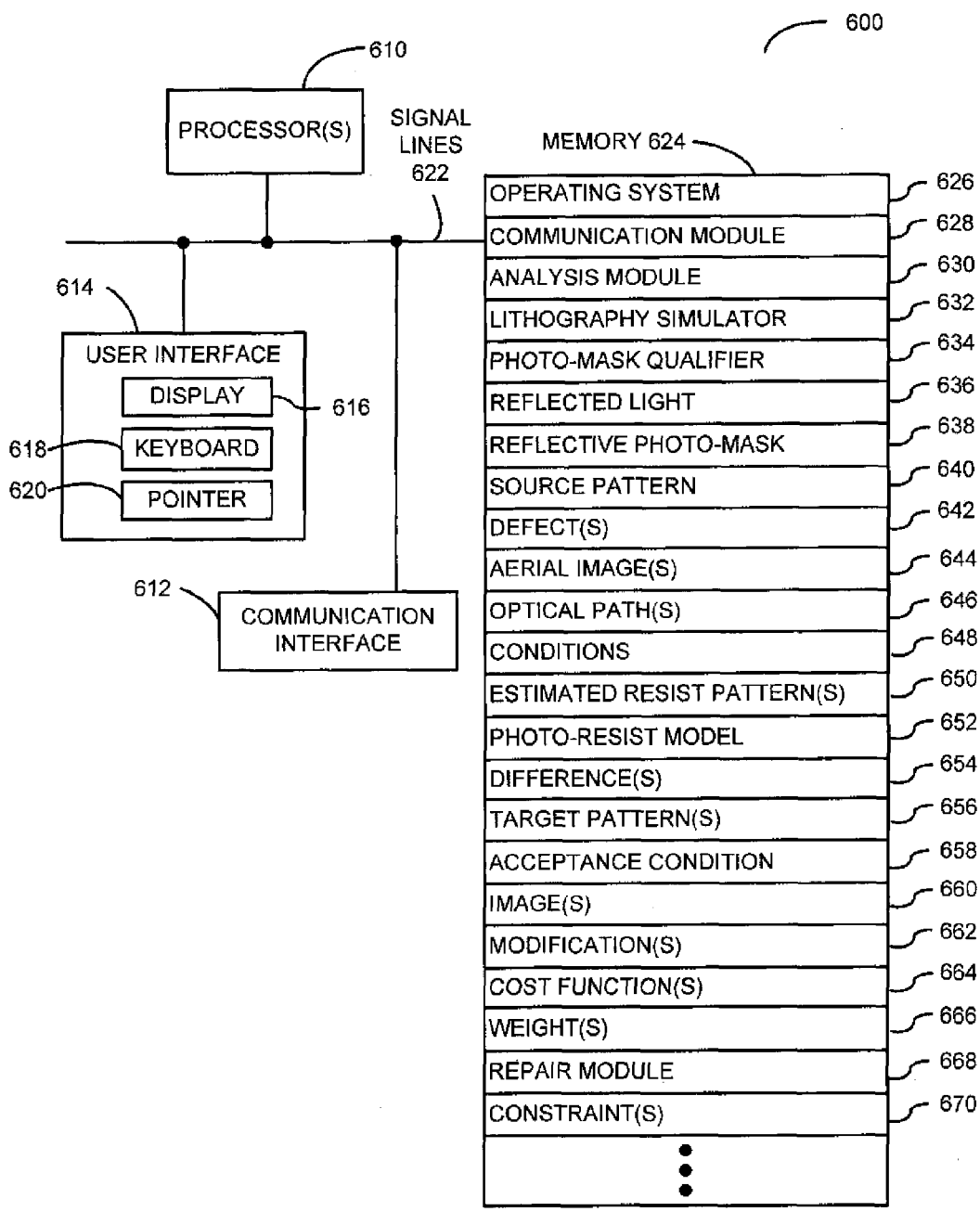
FIG. 6 is a block diagram illustrating a computer system in accordance with an embodiment of the present invention.

We now discuss computer systems for implementing the calculation technique. FIG. 6 presents a block diagram illustrating a computer system 600. Computer system 600 includes one or more processors 610, a communication interface 612, a user interface 614, and one or more signal lines 622 coupling these components together. Note that the one or more processing units 610 may support parallel processing and/or multi-threaded operation, the communication interface 612 may have a persistent communication connection, and the one or more signal lines 622 may constitute a communication bus. Moreover, the user interface 614 may include a display 616, a keyboard 618, and/or a pointer 620, such as a mouse.

Memory 624 in the computer system 600 may include volatile memory and/or non-volatile memory. More specifically, memory 624 may include ROM, RAM, EPROM, EEPROM, flash, one or more smart cards, one or more magnetic disc storage devices, and/or one or more optical storage devices. Memory 624 may store an operating system 626 that includes procedures (or a set of instructions) for handling various basic system services for performing hardware dependent tasks. The memory 624 may also store procedures (or a set of instructions) in a communication module 628. The communication procedures may be used for communicating with one or more computers and/or servers, including computers and/or servers that are remotely located with respect to the computer system 600.

Memory 624 may also include multiple program modules (or a set of instructions), including: analysis module 630 (or a set of instructions), lithography simulator 632 (or a set of instructions), photo-mask qualifier 634 (or a set of instructions), and/or repair module 668 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software and/or software in a photo-mask repair system.

During operation of computer system 600, analysis module 630 may determine reflected light 636 from a model of a reflective photo-mask 638 based on a source pattern 640 that illuminates reflective photo-mask 638. This model of the reflective photo-mask may include one or more defects 642.

Next, lithography simulator 632 may calculate one or more aerial image(s) 644 in a forward optical calculation using reflected light 636 and information about one of optical paths 646. This calculation may also use photolithographic conditions 648. Furthermore, lithography simulator 632 may calculate estimated resist pattern(s) 650 using one or more aerial image(s) 644 and a photoresist model 652.

After these calculations are performed, photo-mask qualifier 634 may identify a difference(s) 654 (or features) between aerial image(s) 644 and/or estimated resist pattern(s) 650 and target or reference pattern(s) 656 (such as portions of a circuit), and may determine an acceptance condition 658 of the reflective photo-mask based on the identified difference(s) 654.

Alternatively or additionally, during operation of computer system 600 analysis module 630 may optionally extract a contour of a mask pattern in a reflective photo-mask from one of images 660 and/or may optionally determine a profile of the reflective photo-mask. Moreover, analysis module may align the mask pattern associated with the extracted contour and the determined profile.

Using the aligned information, analysis module 630 may identify one or more potential defects 642 in the reflective photo-mask, for example, based on a comparison with one or more target patterns(s) 656 (such as a target mask pattern). Moreover, lithography simulator 632 may calculate one or more aerial images 644 (or contours) and/or estimated resist patterns 650 using a forward optical calculation, and a subset of the one or more potential defects 642 may be determined by analysis module 630 based on a subsequent comparison with one or more target patterns(s) 656. This subset may include those defects that 'print' during the photolithographic process.

Next, analysis module 630 may calculate one or more modification(s) 662 to a mask pattern in reflective photo-mask 638 based an inverse optical calculation performed by lithography simulator 632 using reflected light 636, information about one of optical paths 646, and at least the subset of the one or more potential defects 642. As noted previously, the inverse optical calculation may be a constrained inverse optical calculation and may be based on one or more cost function(s) 664 and one or more constraints 670. Furthermore, the cost function(s) 664 may be determined during the inverse optical calculation using one or more weight(s) 666, which may correspond to different process conditions 648 in the photolithographic process.

The one or more modification(s) 662 may be used to modify or repair reflective photo-mask 638. For example, information or instructions associated with the one or more modification(s) 662 may be provided by computer system 600 to a photo-mask repair system. Alternatively, repair module 668 may modify reflective photo-mask 638 based on the one or more modification(s) 662. In some embodiments, prior to modifying reflective photo-mask 638, analysis module 630 decomposes the one or more modification(s) 662 into an etching modification to reflective photo-mask 638 and a deposition modification to reflective photo-mask 638.

Instructions in the various modules in memory 624 may be implemented in a high-level procedural language, an object-oriented programming language, and/or in an assembly or machine language. The programming language may be compiled or interpreted, i.e, configurable or configured to be executed, by the one or more processing units 610.

In some embodiments, at least some of the information in memory 624 is encrypted. For example, the lithographic simulator 632 and/or its output files (such as estimated resist pattern(s) 650) may be encrypted. Furthermore, information 'stored' in memory 624 in FIG. 6 may be stored locally and/or at remote locations.

Although the computer system 600 is illustrated as having a number of discrete items, FIG. 6 is intended to be a functional description of the various features that may be present in the computer system 600 rather than as a structural schematic of the embodiments described herein. In practice, and as recognized by those of ordinary skill in the art, the functions of the computer system 600 may be distributed over a large number of servers or computers, with various groups of the servers or computers performing particular subsets of the functions. In some embodiments, some or all of the functionality of the computer system 600 may be implemented in one or more ASICs, one or more field programmable gate arrays (FPGAs), and/or one or more digital signal processors (DSPs). In some embodiments the functionality of the computer system 600 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, reflective photo-mask 200 (FIG. 2A), forward optical calculation 300 (FIG. 3), and/or computer system 600 include fewer or additional components. Furthermore, in these embodiments two or more components may be combined into a single component and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for calculating a modification to a reflective photo-mask, comprising:
   aligning a mask pattern in a first image of the reflective photo-mask and a second image of the reflective photo-mask, wherein the first image and the second image correspond to different types of analysis techniques that measure information associated with at least one of a contour in the mask pattern and a profile of the reflective photo-mask;
   identifying a group of potential defects in the reflective photo-mask based on the aligned first and second images; and
   calculating the modification to the reflective photo-mask based on at least a subset of the group of potential defects using an inverse optical calculation to correct an impact of at least the subset of the defects in a photo-lithographic process, wherein, during the inverse optical calculation, a cost function at an image plane in a model of the photolithographic process is used to determine the modification to the reflective photo-mask at an object plane in the model of the photolithographic process, wherein the cost function corresponds to a difference between a reference pattern associated with a target mask pattern and a calculated pattern associated with a modified reflective photo-mask, and wherein the modified reflective photo-mask includes the modification to the reflective photo-mask determined in a previous iteration during the inverse optical calculation.

2. The method of claim 1, wherein the first image includes the contour of the mask pattern corresponding to a scanning-electron-microscope image of the mask pattern of the reflective photo-mask and the second image includes the profile of the reflective photo-mask corresponding to atomic-force-microscope image of the reflective photo-mask.

3. The method of claim 2, wherein, prior to aligning the first image and the second image, the method further involves extracting the contour and determining the profile.

4. The method of claim 1, wherein identifying the group of potential defects involves calculating an aerial image at the image plane in the photolithographic process.

5. The method of claim 1, wherein the inverse optical calculation includes a constrained inverse optical calculation in which the modification is restricted to discrete values.

6. The method of claim 5, wherein the discrete values correspond to an etching step size and an etching pixel size used when modifying the reflective photo-mask.

7. The method of claim 5, wherein the discrete values correspond to a deposition step size and a deposition pixel size used when modifying the reflective photo-mask.

8. The method of claim 1, wherein the reference pattern includes a reference aerial image at the image plane and the calculated pattern includes an aerial image at the image plane.

9. The method of claim 1, wherein the reference pattern includes a reference contour at the image plane and the calculated pattern includes a contour at the image plane.

10. The method of claim 1, the reference pattern and the calculated pattern correspond to a set of process conditions during the photolithographic process.

11. The method of claim 10, wherein the set of process conditions include different focal conditions and different exposure latitudes.

12. The method of claim 10, wherein the cost function includes different weights for different process conditions in the set of process conditions.

13. The method of claim 1, wherein, after calculating the modification, the method further involves modifying the reflective photo-mask based on the calculated modification.

14. The method of claim 13, wherein modifying the reflective photo-mask involves etching the reflective photo-mask.

15. The method of claim 13, wherein modifying the reflective photo-mask involves depositing a material on the reflective photo-mask.

16. The method of claim 13, wherein, prior to modifying the reflective photo-mask, the method further involves decomposing the modification into an etching modification to the reflective photo-mask and a deposition modification to the reflective photo-mask.

17. The method of claim 1, wherein the modification includes a modification to the mask pattern in an absorption layer in the reflective photo-mask.

18. The method of claim 1, wherein, after identifying the group of potential defects and prior to calculating the modification, the method further involves determining the subset of the group of potential defects that modify a wafer pattern to be produced using the reflective photo-mask in the photo-lithographic process.

19. A computer-program product for use in conjunction with a computer system, the computer-program product comprising a non-transitory computer-readable storage medium and a computer-program mechanism embedded therein to calculate a modification to a reflective photo-mask, the computer-program mechanism including:
    instructions for aligning a mask pattern in a first image of the reflective photo-mask and a second image of the reflective photo-mask, wherein the first image and the second image correspond to different types of analysis techniques that measure information associated with at least one of a contour in the mask pattern and a profile of the reflective photo-mask;
    instructions for identifying a group of potential defects in the reflective photo-mask based on the aligned first and second images; and
    instructions for calculating the modification to the reflective photo-mask based on at least a subset of the group of potential defects using an inverse optical calculation to correct an impact of at least the subset of the defects in a photo-lithographic process, wherein, during the inverse optical calculation, a cost function at an image plane in a model of the photolithographic process is used to determine the modification to the reflective photo-mask at an object plane in the model of the photolithographic process, wherein the cost function corresponds to a difference between a reference pattern associated with a target mask pattern and a calculated pattern associated with a modified reflective photo-mask, and wherein the modified reflective photo-mask includes the modification to the reflective photo-mask determined in a previous iteration during the inverse optical calculation.

20. A computer system, comprising:
at least one processor;
at least one memory; and
at least one program module, the program module stored in the memory and configured to be executed by the processor to calculate a modification to a reflective photo-mask, the program module including:
    instructions for aligning a mask pattern in a first image of the reflective photo-mask and a second image of the reflective photo-mask, wherein the first image and the second image correspond to different types of analysis techniques that measure information associated with at least one of a contour in the mask pattern and a profile of the reflective photo-mask;
    instructions for identifying a group of potential defects in the reflective photo-mask based on the aligned first and second images; and
    instructions for calculating the modification to the reflective photo-mask based on at least a subset of the group of potential defects using an inverse optical calculation to correct an impact of at least the subset of the defects in a photo-lithographic process, wherein, during the inverse optical calculation, a cost function at an image plane in a model of the photolithographic process is used to determine the modification to the reflective photo-mask at an object plane in the model of the photolithographic process, wherein the cost function corresponds to a difference between a reference pattern associated with a target mask pattern and a calculated pattern associated with a modified reflective photo-mask, and wherein the modified reflective photo-mask includes the modification to the reflective photo-mask determined in a previous iteration during the inverse optical calculation.

* * * * *